(12) United States Patent
Delano

(10) Patent No.: US 6,945,313 B2
(45) Date of Patent: Sep. 20, 2005

(54) HEAT TRANSFER APPARATUS AND METHOD OF MANUFACTURING AN INTEGRATED CIRCUIT AND HEAT SINK ASSEMBLY

(75) Inventor: Andrew Douglas Delano, Ft. Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 186 days.

(21) Appl. No.: 10/677,079

(22) Filed: Oct. 1, 2003

(65) Prior Publication Data

US 2004/0060688 A1 Apr. 1, 2004

Related U.S. Application Data

(62) Division of application No. 09/934,422, filed on Aug. 21, 2001, now Pat. No. 6,702,001.

(51) Int. Cl.[7] .................................................. F28F 7/00
(52) U.S. Cl. ...................... 165/80.3; 165/185; 361/704; 257/719
(58) Field of Search ............................... 165/80.3, 185, 165/79, 80.2; 361/704, 718, 705, 708, 719, 702, 707; 257/718, 719; 174/16.3

(56) References Cited

U.S. PATENT DOCUMENTS

| | | |
|---|---|---|
| 4,611,238 A | 9/1986 | Lewis et al. |
| 4,639,829 A | 1/1987 | Ostergren |
| 4,884,631 A | 12/1989 | Rippel |
| 4,970,579 A | 11/1990 | Arldt et al. |
| 5,012,386 A * | 4/1991 | McShane et al. ............ 361/715 |
| 5,288,203 A | 2/1994 | Thomas |
| 5,335,722 A | 8/1994 | Wu |
| 5,353,863 A | 10/1994 | Yu |
| 5,367,193 A * | 11/1994 | Malladi ....................... 257/707 |
| 5,377,745 A | 1/1995 | Hsieh |
| 5,459,352 A * | 10/1995 | Layton et al. ............... 257/724 |
| 5,484,262 A | 1/1996 | Thomas |
| 5,583,746 A | 12/1996 | Wang |
| 5,587,882 A * | 12/1996 | Patel .......................... 361/705 |
| 5,629,560 A | 5/1997 | Katsui |
| 5,648,890 A * | 7/1997 | Loo et al. .................... 361/704 |
| 5,757,620 A * | 5/1998 | Edwards et al. ............. 361/705 |
| 5,785,116 A | 7/1998 | Wagner |
| 5,907,474 A | 5/1999 | Dolbear |
| 5,975,194 A | 11/1999 | Wagner |
| 5,990,552 A * | 11/1999 | Xie et al. ..................... 257/718 |
| 6,054,198 A * | 4/2000 | Bunyan et al. ............. 428/40.5 |
| 6,121,680 A * | 9/2000 | Chiu et al. ................... 257/714 |
| 6,152,214 A | 11/2000 | Wagner |
| 6,285,078 B1 * | 9/2001 | Nelson ........................ 257/712 |
| 6,396,700 B1 * | 5/2002 | Chu et al. .................... 361/705 |
| 6,496,373 B1 * | 12/2002 | Chung ......................... 361/705 |

* cited by examiner

*Primary Examiner*—Tho V Duong
(74) *Attorney, Agent, or Firm*—June L. Bouscaren

(57) ABSTRACT

A method for cooling integrated circuit assemblies uses a heat sink having a base and a displacement element having a size substantially similar to an area of heat concentration appropriately positioned on the integrated circuit. A compressive force placed upon the displacement element between the heat sink and the integrated circuit provides an optimum thermal resistance at an interface between the IC and the heat sink for efficient transfer of heat to the heat sink.

9 Claims, 8 Drawing Sheets

Agil nt PDNO 10010641-2
"Heat Transfer Apparatus and Method of Making Same"
Inventor: Andy Delano {Program to Calculate Optimal Initial size of TIM}

820 — FUNCTIONAL Afinal(A_lid,A)     {function to determine if final Area of TIM is within lid area (assures proper calculations of pressure on TIM)}

If(A>A_lid) then Afinal=A_lid
    endif
    If(A=A_lid) then Afinal=A_lid
    endif
    If(A<A_lid) then Afinal=A
    endif
end FUNCTION Afinal2(A_epsilon,A)     {function to determine if final Area of TIM is within effective area (assures proper calculation of theta)}

If(A>A_epsilon) then Afinal2=A_epsilon
    endif
    If(A=A_epsilon) then Afinal2=A_epsilon
    endif
    If(A<A_epsilon) then Afinal2=A
    endif
end

FIG. 8

801 — A_lid=30.8*30.8*convert(mm^2,m^2)    {Area of Processor lid}

802 — ti=3*convert(mil,m)    {Initial Thickness of TIM}
    ti_micron=ti*covert(m,micron)
    {l=.4} — 806    {Initial length of TIM Al=lxl in inches}
805 — Al=l^2*convert(in^2,m^2)    {Initial Area of TIM in m^2}
    Al_in2=Al*convert(m^2,in^2)    {Initial Area of TIM in in^2}
807 — V=ti*Al    {Initial Volume of TIM}
803 — F=20     — 811    {Force on TIM in lbf (assumed constant)}
    P=F/Af_in2    {Final Pressure on TIM in psi (note:
810 — Af_in2 is Af in in^2 and Af comes from Afinal function)}
    V=t_m*A — 809    {Final Volume of TIM = initial volume}
    — 808

{TIM thickness vs. pressure and bulk conductivity data}
812 — t=-6.0989*ln(P)+55.2    {bergquist tim thickness (microns) vs. pressure (psi), k=.7 W/mK}
804 — k=1.20    {Conductivity of TIM W/mK}
    t_m=t*convert(micron,m)
    A_in2=A*convert(m^2,in^2)    {Final Area of TIM}
813 — Af=Afinal(A_lid,A)    {Call function Afinal}
    Af_in2=Af*convert(m^2,in^2)    {Final Area of TIM converted to in^2}

814 — eta=.15
                801
                      {eta = A_epsilon/A_lid}
    A_psilon=A_lid*eta    {Effective Area: Equivalent area for uniform heat flux}
815  Af2=Afinal2(A_epsilon,A)    {Call function Afinal2}
    theta=t_m/(k*Af2)    {Thermal resistance of TIM}

HEAT TRANSFER APPARATUS AND METHOD OF MANUFACTURING AN INTEGRATED CIRCUIT AND HEAT SINK ASSEMBLY

This is a Divisional of application Ser. No. 09/934,422, filed on Aug. 21, 2001, now U.S. Pat. No. 6,702,001 the entire disclosure of which is incorporated herein by reference.

BACKGROUND

As microprocessors become faster and more powerful, they also generate an increasing amount of heat. This heat must be dissipated to maintain the optimum operating temperature of the component. Without proper heat dissipation, the microprocessor overheats and ceases to operate. The microprocessor cooling effort is further complicated by the common practice of encasing the microprocessor. The practice of encasing the microprocessor advantageously increases the durability of the part by protecting it from dust, dirt, and impact. The case conventionally includes a lid, also referred to as a "heat spreader". The lid that protects the component typically has a larger surface area than the microprocessor and also serves to distribute heat generated by the microprocessor over the larger surface area of the lid. This heat distribution is not even and there exists a localized area of heat concentration on the lid just above the location of the microprocessor. The heat spreading function of the lid is insufficient to maintain the microprocessor at an appropriate operation temperature. Accordingly, most microprocessors require an attached heat sink to draw the heat away from the part and maintain the operating temperature.

There exist conventional heat sink designs that can properly dissipate the required amount of heat once the heat is transferred to the heat sink from the heat source. If heat is not transferred fast enough, even a perfectly efficient heat sink cannot do the job and the part will overheat. Traditionally, heat transfer from a heat source to a heat sink occurs by way of a mechanical communication. For example, a thermally conductive area of the heat sink, which is typically a metal, is pressed against a thermally conductive area, also typically metal, of the heat source. Experience shows, however, that bare metal to metal contact is not an efficient heat transfer mechanism. It has further been found that heat transfer can be improved by use of a thermal interface material that is able to conform under pressure to fill small air pockets that exist between the heat source and the heat sink. Even the best of thermal interface materials, however, do not transfer sufficient heat unless made extremely thin. Positioning a layer of thermal interface material between a heat source and a heat sink requires that the thermal interface material be under a compressive force. In the case of a microprocessor as the heat source, too much compressive force can damage the heat source itself or a printed circuit board to which the microprocessor is attached. There remains a need, therefore, for an efficient heat sink that addresses the aforesaid challenges.

SUMMARY

An apparatus for removing heat from a heat source where the heat source has an area of heat concentration comprises a heat sink having a base and a displacement element having a size substantially similar to the area of heat concentration. A compressive force is placed upon the displacement element between the heat sink and the heat source.

An apparatus comprises a heat source with an area of heat concentration, a heat sink, and a thermal interface material between the heat source and the heat sink. The apparatus further comprises a means for applying a compressive force on the thermal interface material between the heat source and the heat sink and a means for concentrating the compressive force on the area of heat concentration.

An apparatus comprises an integrated circuit generating heat and having a lid, the lid having a surface area larger than a surface area of the integrated circuit resulting in an area of heat concentration during operation of the integrated circuit. The apparatus further comprises a heat sink and a displacement element having a surface area sized substantially similar to the area of heat concentration, and a spring clip. The spring clip places a compressive force on the displacement element between the heat sink and the lid.

A method for mounting a heat sink to a heat source comprises the steps of providing a heat source and a heat sink, the heat source having an area of heat concentration and determining an optimum size for a displacement element as a function of the area of heat concentration. The method further comprises placing the optimally sized displacement element between the heat source and the heat sink, and applying compression to the optimally sized displacement element between the heat source and the heat sink.

A method of manufacturing an integrated circuit assembly comprising the steps of providing a heat sink having a base, determining a size and position of an area of heat concentration on the integrated circuit, and determining an optimum size for a displacement element as a function of the area of heat concentration. The method further comprises placing the optimally sized displacement element between the integrated circuit and the base, and applying compression to the optimally sized displacement element between the integrated circuit and the base.

A method of manufacturing a printed circuit board assembly comprising the steps of providing an integrated circuit mounted to a printed circuit board, the integrated circuit requiring cooling during operation and having an area of heat concentration. The method further comprises providing a heat sink for the integrated circuit, determining an optimum size for a displacement element as a function of the area of heat concentration, and placing the optimally sized displacement element between the integrated circuit and the heat sink. Compression is applied to the optimally sized displacement element between the integrated circuit and the heat sink.

An advantage of a heat dissipation apparatus according to the teachings of the present invention is efficient transfer and dissipation of heat generated by a heat source.

BRIEF DESCRIPTION OF THE DRAWINGS

FIG. 8 is example code for an analytical model according to the teachings of the present invention.

DETAILED DESCRIPTION

Figure 1:
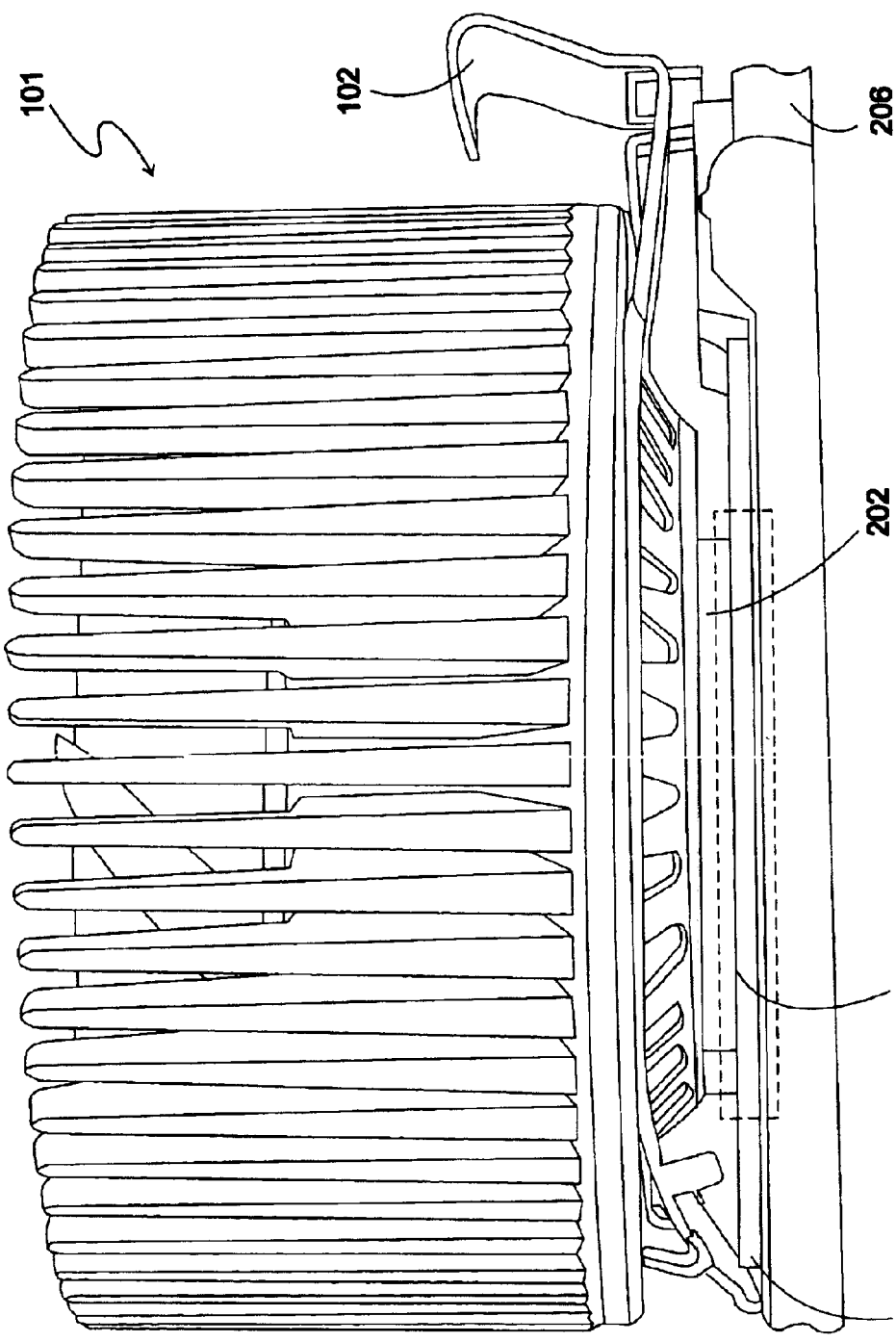
FIG. 1 is a plan view of a conventional heat sink apparatus with a circled area representing the area shown in detail in FIG. 2 of the drawings.
Figure 2:
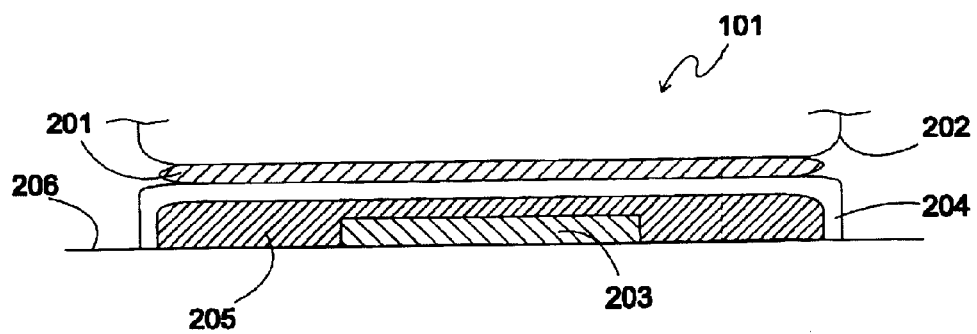
FIG. 2 is a cross sectional view of a conventional heat sink apparatus as attached to an encased microprocessor as a heat source and showing details of an interface between the heat sink and the heat source.

With reference to FIGS. 1 and 2, there is shown plan and cross sectional views, respectively, of a conventional heat sink apparatus 101 in which thermal interface material is interposed at an interface 201 between a heat sink base 202 and a heat source 203,204. The heat source 203,204 may comprise a microprocessor 203 encased by a lid 204 or may be any other kind of heat source that requires efficient cooling. The heat sink may be of any conventional design that has a base 202 for attachment to the heat source 203, 204. The heat sink illustrated in the drawings is an example of a particularly efficient heat sink and is taught in U.S. Pat. Nos. 5,785,116, 5,975,194, and 6,152,214 the teachings of which are hereby incorporated by reference. With reference to FIG. 2, a thermally conductive gel is disposed in a cavity 205 created by the lid 204 that encases the microprocessor 203 creating a relatively efficient transfer of heat from the microprocessor 203 to the lid 204. As shown in the illustration, the lid 204 presents an external surface area that is larger than an upper surface area of the microprocessor 203. The heat sink base 202 covers most of the lid's 204 surface area. A mechanism such as a spring clip, 102, places the interface 201 with the thermal interface material in compression between the base 202 and the lid 204. The compressive force causes the thermal interface material 201 to thin and spread thereby reducing the thickness of the thermal interface material 102.

Figure 3:
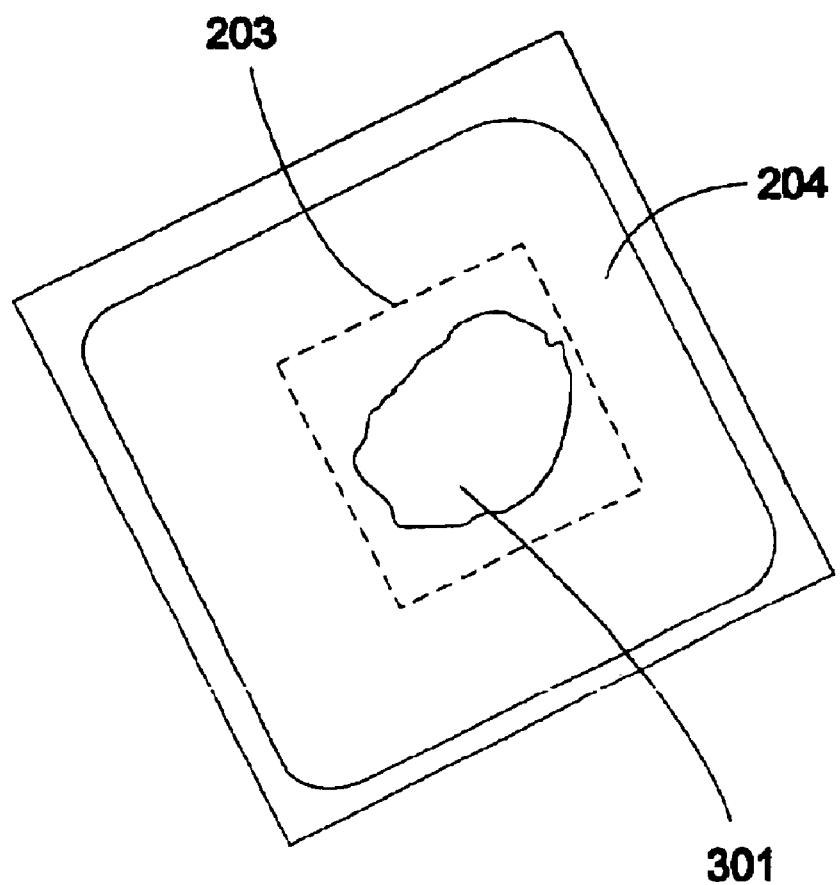
FIG. 3 shows a typical uneven heat flux for a microprocessor illustrating the heat transfer and dissipation challenge addressed by the teachings of the present invention.

With reference to FIG. 3 of the drawings, there is shown a top plan view of a microprocessor 203 encased in a lid 204 illustrating a heat flux at a moment in time just after the microprocessor is powered and without any heat dissipation mechanism. FIG. 3 illustrates a typical microprocessor having a top surface area measuring 9 mm by 11 mm encased by the lid 204 having a top surface area measuring 31 mm by 31 mm. A position of the microprocessor 203 is shown in phantom line to illustrate the approximate size and position of the microprocessor 203 relative to the lid 204. From the illustration, it is evident that there is an area of heat concentration 301. The area of heat concentration 301 is just above the position of the microprocessor 203 within the lid 204 and corresponds is position and size to the size of the microprocessor heat source 203. In the absence of a heat dissipation mechanism and in a steady state condition, the entire lid 204 equalizes to the same temperature, the microprocessor 203 overheats and the part fails. In the presence of a heat dissipation mechanism, the thermal resistance of the interface 201 permits transfer of the heat from the heat source 203/204 through the thermal interface material to the heat base 202 for eventual dissipation of the generated heat into the air. Accordingly, the thermal interface material in the interface 201 is heated in the process. Heat applied to the thermal interface material may cause it to further flow and thin, advantageously further reducing the overall interface's 201 thermal resistance.

The following relationship:

$$\frac{\text{Interface thickness}}{\text{Conductivity of the interface material} \cdot \text{Cross sectional area of the interface material}} = \frac{\text{Resistance of the interface}}{\text{in units of degree C./Watt}}$$

defines the expected thermal resistance of the interface. Accordingly, one of ordinary skill in the art appreciates that it is advantageous to reduce the interface thickness to the smallest feasible size and maximize the cross sectional area of the interface material for minimum interface resistance and, therefore, maximum heat transfer across the interface 201 from the heat source 203,204 to the heat sink 101. Compressive force on the thermal interface material 201 serves to decrease the thickness of the interface. The maximum compressive force that the heat source 203/204 is able to withstand is defined by the physical properties of the encased part and is typically a finite value. This finite value, therefore, establishes the minimum achievable interface resistance. An additional consideration is a bonding strength of the interface 201 once compressive forces and heat is applied to the thermal interface material. The bonding strength of the heat sink to the heat source corresponds to a final area that contacts the base 202, the thermal interface material, and the heat source. The larger the final area of contact between base 202, thermal interface material, and the heat source, the stronger the bond between them. As the thermal interface material is heated, it subsequently flows and defines the final area from which the bond strength results. It is advantageous for the heat sink 101 to be removable from the heat source 203/204 for replacement as necessary. In many cases, however, applying the maximum compressive force to the interface 201 causes the thermal interface material to significantly thin and spread over a wide area. When the thermal interface material expands to cover an area as large as the lid 204, the bonding strength of the interface often exceeds that of an attachment strength of the heat source 203/204 to a substrate 206, such as a printed circuit board. Accordingly, the minimum practical thermal resistance is defined by the maximum compressive force that may be applied without causing the bond strength of the interface 201 to exceed that of the attachment strength of the heat source 203/204 to the substrate 206.

Figure 4:
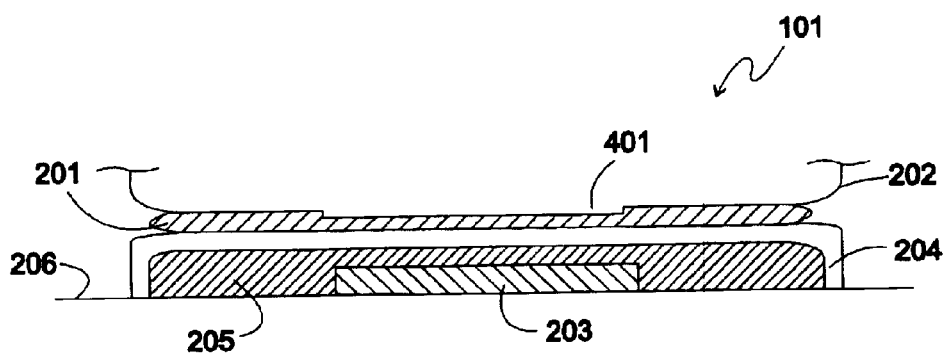
FIG. 4 is a cross sectional view of a first embodiment of an apparatus according to the teachings of the present invention.

With reference to FIG. 4 of the drawings, there is shown a first embodiment of an apparatus according to the teachings of the present invention in which the base 202 of the heat sink 101 further includes a displacement element 401. The displacement element 401 in a preferred embodiment has a substantially similar surface area to the surface area of the area of heat concentration 301. The displacement element 401 in the first embodiment is unitary with the base 202 and comprises a small step, on the order of approximately 25–50 microns. The displacement element 401 may be made by machining away a small height of base material leaving a circular central stepped section remaining. The displacement element 401 is positioned over the area of heat concentration 301 with thermal interface material disposed at the interface 201 of the displacement element 401 and the heat source 203/204. When the interface 201 is subject to the compressive force, the displacement element localizes the compressive force causing the pressure at the area of heat concentration 301 to be greater than the pressure applied for the same compressive force in the absence of the displacement element 401. The overall compressive force does not exceed that which the lid 204 is able to withstand. The displacement element 401, therefore, serves to localize the pressure on the lid 204 where it can be most effective. The conformal thermal interface material in the interface 201 responds to the pressure by thinning and spreading and the thickness of the interface 210 is reduced thereby advantageously also reducing the thermal resistance at the interface 201. When power is applied to the microprocessor 203, the thermal interface material at the interface 201 heats and further flows and thins, further reducing the thermal resistance of the interface 210. As the thermal interface material flows, it flows past the displacement element 401, filling the space between the lid 204 and the base 202. While the thermal resistance outside of the displacement element 401 is higher than the thermal resistance at the displacement element 401, it is sufficiently low to permit additional heat transfer from the heat source 203/204 to the base 202, which provides an incremental advantage. Due to the fact that the area subject to the highest pressure is smaller than the surface area of the entire base 202, the bonding strength of the interface is reduced relative to prior art solutions. Accordingly, an apparatus according to the teachings of the present invention improves the thermal resistance of the interface 201 and therefore, the efficiency of the heat sink, while simultaneously addressing the issue of interface bonding strength.

Figure 5:
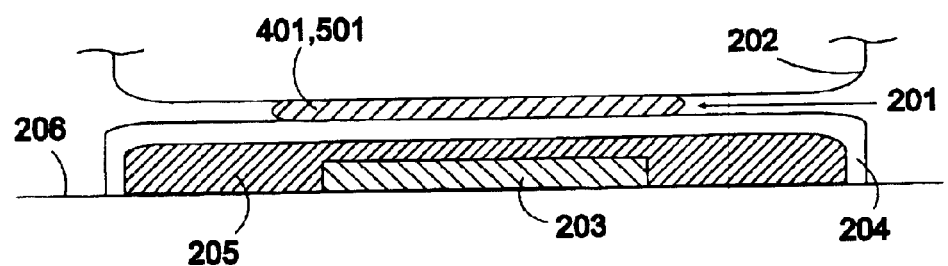
FIG. 5 is a cross sectional view of a second embodiment of an apparatus according to the teachings of the present invention.

With reference to FIG. 5 of the drawings, there is shown a second embodiment of an apparatus according to the teachings of the present invention in which a supported thermal interface material 501 comprises the displacement element 401. An example of a supported interface material 501 is Power Devices Co. Powerstrate Foil product and comprises a foil based laminate with a conformal thermal interface material on either side of the foil. There are various different versions of the product commercially available, each different version defining a particular size. Advantageously, the supported material provides sufficient displacement to concentrate the pressure from the compressive force at the area of heat concentration 301 according to the teachings of the present invention in combination with the thermal interface material itself. The pressure causes the interface material to conform to the irregularities in the base 202 and the lid 204 and to thin, thereby improving contact and reducing the thermal resistance of the interface 201. Because the area of the thermal interface material is smaller relative to prior art solutions, this solution also reduces the bond strength of the interface 201 thereby improving the thermal resistance of the interface while also reducing the bond strength of the interface.

Figure 6:
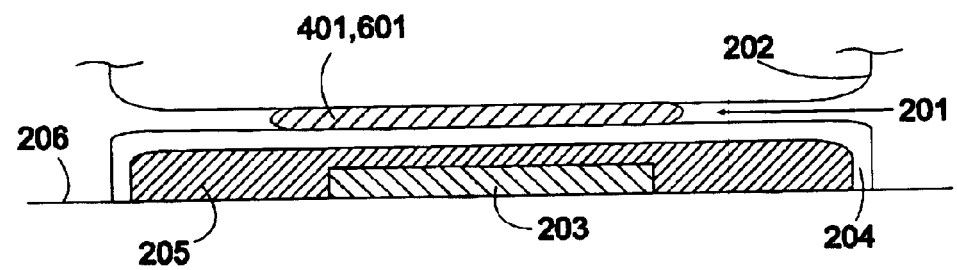
FIG. 6 is a cross sectional view of a third embodiment of an apparatus according to the teachings of the present invention.

With reference to FIG. 6 of the drawings, there is shown a third embodiment of an apparatus according to the teachings of the present invention in which an unsupported thermal interface material 601 comprises the displacement element 401. An example of an unsupported interface material 601 is Berquist Co. HF225 product or Power Devices Co. Powerfilm product and is similar or the same as the thermal interface material used in prior art solutions. The difference in this embodiment is that the unsupported thermal interface material 601 is placed on or just inside the perimeter of the area of heat concentration 301 instead of on the entire lid 204. While this solution is counter-intuitive and does not follow the current teachings of the art, it is better than prior art solutions because the unsupported thermal interface material 601 provides sufficient pressure increase at the area of heat concentration 301 when compressive force is applied to the interface 201 to thin out the interface thickness thereby reducing the thermal resistance. The reduction in interface thickness more than compensates for the decreased cross sectional area and higher thermal resistance outside of the area of heat concentration 301. Additionally, the reduced surface area of thermal interface material also reduces the bond strength permitting removal of the heat sink from the lid 204 for replacement of the microprocessor 203.

Figure 7:
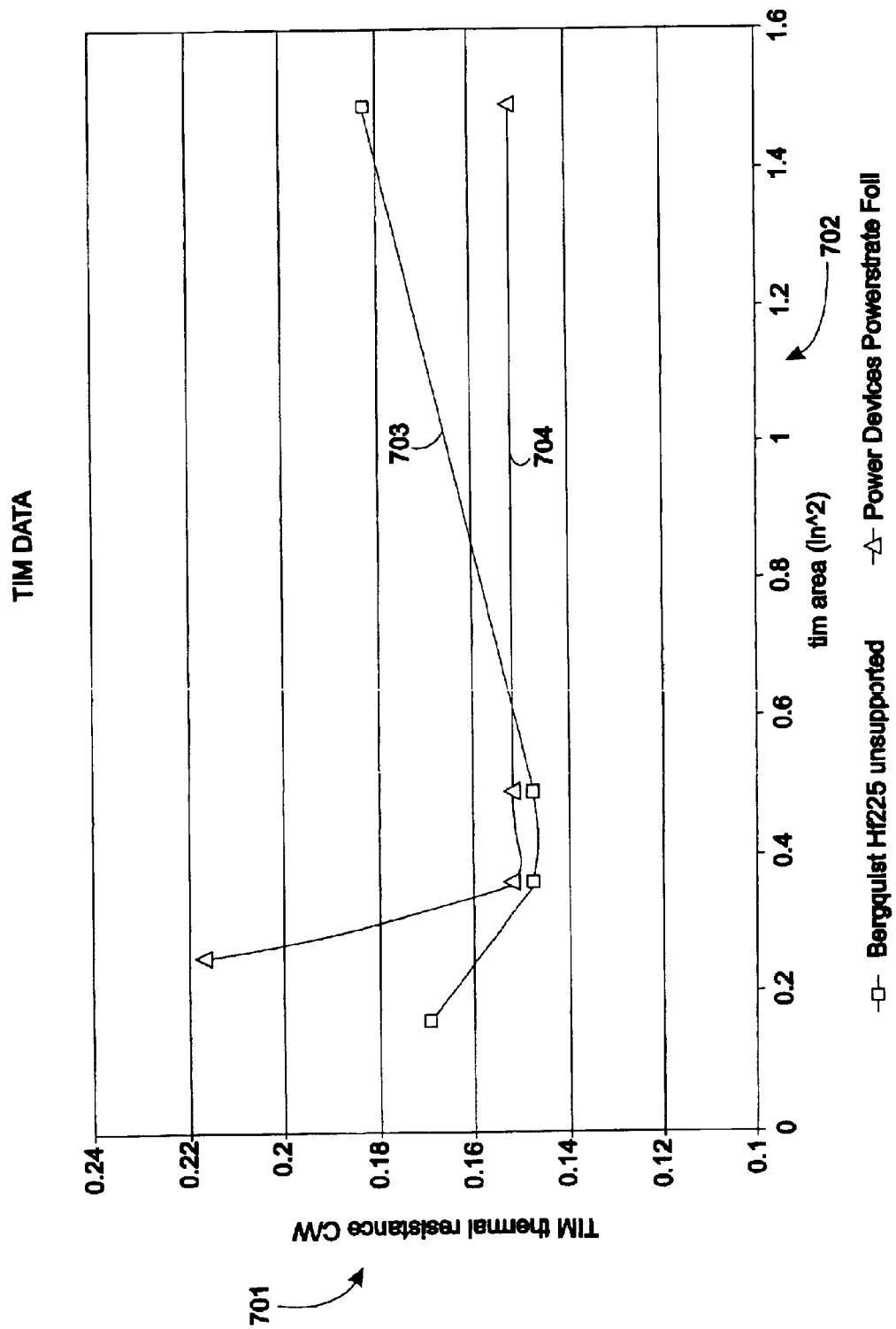
FIG. 7 is a graphical representation of the thermal resistance of two exemplary materials according to the teachings of the present invention.

With reference to FIG. 7 of the drawings, there is shown a graph representing the relationship between thermal resistance as shown on the Y-axis 701 of the graph and an initial surface area of the thermal interface material as shown on the X-axis 702 of the graph. For all data points on the graph, the mechanism that applies the compressive force to the interface 201 is the spring clip 102 and is the same for all measured data points. An unsupported thermal interface material curve 703 shows that an area of thermal interface material that does not cover the area of heat concentration 301 shows a higher thermal resistance than an area of thermal interface material that covers an area substantially equal to the area of heat concentration 301. This behavior is not unexpected because the equation shows that an increase in cross sectional area of the thermal interface material reduces the thermal resistance of the interface. It is interesting to note, however, that as the initial area of thermal interface material increases, for the unsupported thermal interface material 601, the thermal resistance of the interface increases. It has been found that the reason for this rise in thermal resistance is that for a given amount of compressive force, the larger initial surface area thermal interface material samples present more resistance to thinning at the interface 201. Because the thermal resistance of the interface is directly and proportionally related to the thickness of the interface, the fact that the given compressive force is not able to thin the interface is not compensated by the larger cross sectional area of the thermal interface material. Additionally, the larger initial surface area of the thermal interface material results in a higher interface bond strength which does not permit removal of the base 202 from the heat source 203, 204. Accordingly, it has been found that there is an optimum initial surface area size and position for maximum heat transfer.

A supported thermal interface material curve 704 shows that an area of thermal interface material that does not cover the area of heat concentration 301 shows a higher thermal resistance than an area of thermal interface material that covers an area substantially equal to the area of heat concentration 301. The difference is more pronounced than in the unsupported thermal interface material samples shown in curve 703, because the interface 201 is already quite thin and the cross sectional area of the thermal interface material is more of a factor. As the initial surface area of the thermal interface material increases for the supported thermal interface material 501, there is very little change in thermal resistance. It has been found that this occurs because the supported thermal interface material 501 is already thin, the compressive force does not further thin it out to any significant degree. The larger initial surface area of the supported thermal interface material, however, does increase the bond strength of the interface 201 and it is advantageous to keep the initial cross sectional area of the thermal interface material to the minimum necessary to achieve the desired thermal resistance. Accordingly, there is an optimum size and position of both thermal interface materials that follow similar guidelines for slightly different reasons. It is expected that other conformal and thermally conductive materials will behave similarly and follow similar guidelines are presented in the present disclosure when used for optimum heat transfer.

Based upon the teachings herein, it is possible to develop an analytical model of the behavior of the various embodiments of displacement element and thermal interface material and thereby predict an optimum size of thermal interface material. By using no more than the optimum amount of thermal interface material, the bond strength of the base 202 to the heat source via the thermal interface material can be minimized without compromising heat transfer.

The analytical model may be implemented as a computer program that accepts information including fixed value characteristics of the heat source and thermal interface material. The analytical model then establishes constraining equations for the thermal interface material and then solves and presents the optimum size for the thermal interface material of interest. With specific reference to FIG. 8 of the drawings, there is shown example code written for the software application entitled "Engineering Equations Solver (EES)" by f-Chart Software running on a Windows operating system for an analytical model according to the teachings of the present invention. The example code illustrates fixed values for an area of the lid (A_lid) 801, an initial thickness of the thermal interface material (ti) 802, a value for the compressive force applied (F) 803, and the conductivity constant of the thermal interface material (k) 804 are defined. In the illustrative example, the values represent the surface area of the heat source 204 and the compressive force presented by the clip 102 that attaches the heat sink 101 to the heat source 204. The analytical model then defines a series of constraining equations that quantify the characteristics and physical properties acting upon the thermal interface material and include the following:

An initial area of the thermal interface material (A_i) 805 calculated from the length (l) 806 of the material. The present analytical model assumes a square piece of thermal interface material.

An initial volume of the thermal interface material (V) 807 is calculated by determining a product of the initial thickness (ti) 802 and the initial area of the thermal interface material (Ai) 805. A final volume is calculated by determining a product of a final thickness (t_m) 808 and final area of the thermal interface material (A) 809. Because the initial volume and the final volume are the same, these two equations define one of the constraining relationships of the analytical model.

Pressure (P) 810 that is placed on the thermal interface material is calculated as the force (F) 803 divided by the final area of the thermal interface material (Af_in2) 811 in inches squared.

The thickness of the thermal interface material (t) 812 may be defined as a function of the compressive pressure (P) 810 applied to it. In one example the thickness of the thermal interface material (t) 810 may be defined and converted into units of meters as: t_m=(−6.0989*ln(P)+55.2)*convert (micron,m).

In order to assure that the analytical model accounts for the situation where the thermal interface material thins to the point where the area expands beyond the limits of the lid, an "Afinal" function 820 may be defined that will return the value of the calculated area (A) or the value of the surface area of the lid (A_lid), whichever is smaller. This check is somewhat of a verificaiton function because thermal interface material that flows past the perimeter of the lid 204 is no longer available as a heat transfer agent and must therefore be taken out of the equation. The verified value, i.e. the final calculated area or the total area of the lid, is returned as the final surface area of the thermal interface material (Af) 813.

The analytical model further takes into account the presence of a non-uniform heat source 203/204 where there is an area of heat concentration 301 that is a fraction of the total surface area of the heat source 203/204. The analytical model disclosed represents the area of heat concentration as an eta factor 814 where the area of heat concentration is equal to the surface area of the lid (A_lid) 801 multiplied by the eta factor 814. The eta factor 814 as disclosed estimates the behavior of a non-uniform heat source by assuming a two part heat variance; an area of heat concentration with an outer area without heat. One of ordinary skill in the art, however, can use the present teachings to formulate and effectively use other factors and assumptions to define the area of heat concentration 301 consistent with the purposes and heat source behaviors at issue. When the effective area is calculated, another check is performed to assure that the final area of the thermal interface material does not exceed the total area of the lid (A_lid) 801.

Figure 9:
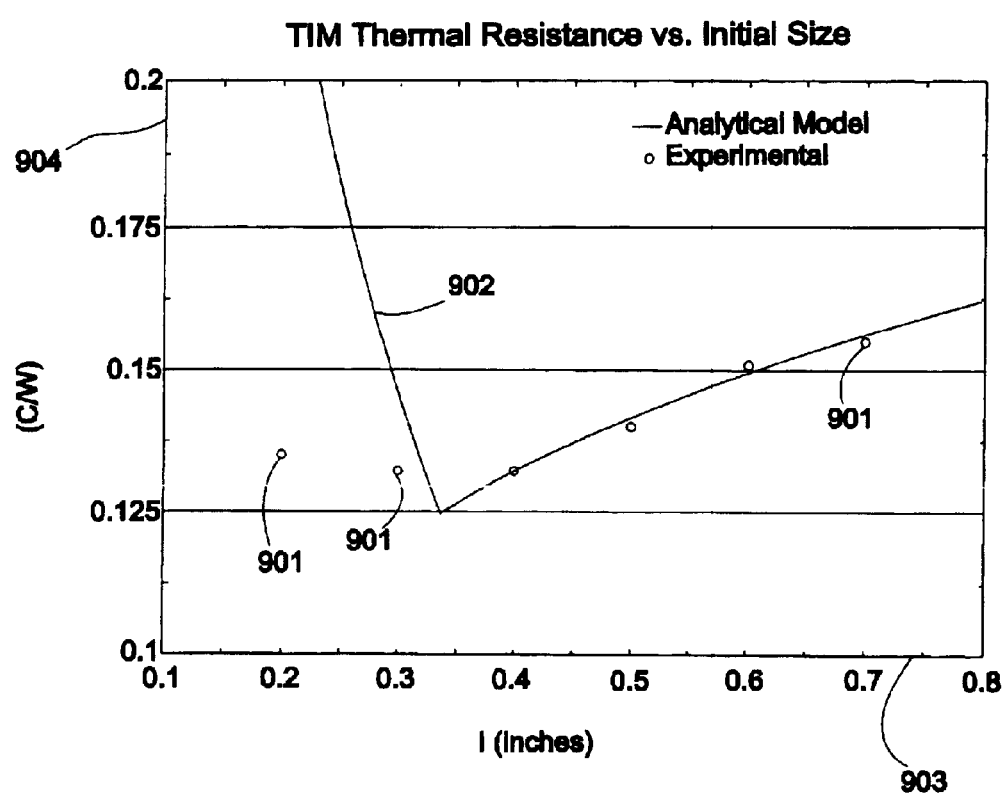
FIG. 9 is a graphical representation showing experimental data as compared to data predicted by the analytical model.

Although the analytical model disclosed is implemented in the software application entitled Engineering Equation Solver ("EES") by f-Chart and runs on a Windows operating system, other software applications and calculated methods may also be used without departing from the teachings of the present invention. To use the analytical model, the disclosed model is run using the "calc min/max" function minimizing theta 815. Theta 815 is the thermal resistance of the thermal interface material and is defined as the final thickness (t_m) 808 divided by the product of the conductivity constant (k) 804 of the thermal interface material multiplied by the final surface area of the thermal interface material. The constraining equations in the analytical model provide a value for the optimum initial surface area of thermal interface material. The analytical model disclosed optimizes the thermal resistance by varying the initial area of the thermal interface material. As one of ordinary skill in the art can appreciate, however, the teachings of the present invention can be used to minimize thermal resistance of the interface by varying other factors such as force (F) 803 and used as appropriate. With specific reference to FIG. 9 of the drawings, there is shown a graphical representation of the experimental behavior 901 of the thermal interface material (shown as data points along the graph) and the predicted behavior 902 of the thermal interface material (shown as a curve along the graph). In the graph, the x-axis 903 represents an initial (i.e. uncompressed) length of one side of the thermal interface material and the y-axis 904 represents thermal resistance 815. The graph shows that the analytical model closely matches the experimental behavior for initial lengths greater than approximately 0.325 square inches. In both cases, both the experimental and analytical models show an optimum initial length. It has been found that the optimum initial length coincides with the final size of thermal interface material that just covers the area of heat concentration 301.

Figure 10:
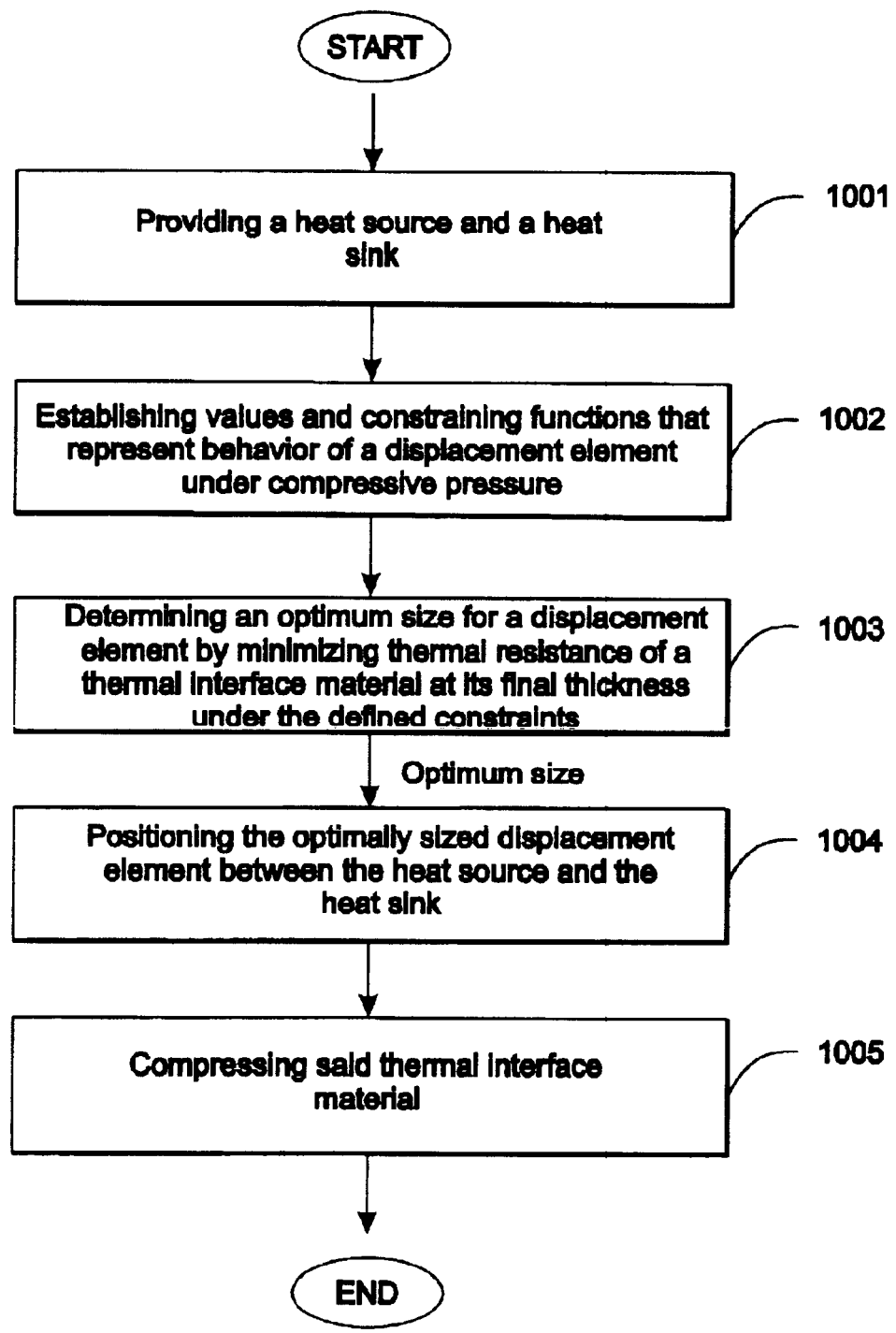
FIG. 10 is a flow chart of a method for mounting a heat sink to a heat source according to the teachings of the present invention.

With specific reference to FIG. 10 of the drawings, there is shown a flow chart according to the teachings of the present invention including use for the analytical model presented herein. A first step 1001 of the method is to provide the heat source 203,204 and a heat sink 101. Thereafter, the method comprises establishing values and constraining functions in an analytical model that represents behavior of a thermal interface material under compressive pressure 1002. Using the analytical model, the method continues by determining an optimum initial size for the thermal interface material by minimizing a thermal resistance of the thermal interface material at its final surface area under the defined constraints 1003. Using the resulting optimum initial size for the thermal interface material, positioning the optimally sized thermal interface material between a base 202 of the heat sink 101 and the heat source 203/204 at step 1004. The last step comprises compressing the optimally sized thermal interface material between the base 202 of the heat sink 101 and the heat source 203/204 to achieve the predicted minimum thermal resistance 1005. This analytical model may be used for the embodiment wherein the displacement element is the thermal interface material. In this case, the optimum initial size of thermal interface material may be placed appropriately and also act as the displacement element to concentrate the compressive force at the area of heat concentration. This analytical model also may be used to determine an optimum size for the displacement element when it is a separate element from the thermal interface material. In this case, an optimum size for the displacement element corresponds to the value of the final surface area of the thermal interface material.

Embodiments described herein illustrate the invention by way of example. For example, materials different than those mentioned and heat dissipation mechanisms different than those pictured may be substituted while still following the teachings of the present invention. Variations of the claimed invention are within the capability of one of ordinary skill in the art given benefit of the prior art and the present disclosure and are, therefore, within the scope of the appended claims.

What is claimed is:

1. A method for mounting a heat sink to a heat source comprising the steps of:

providing a heat source and a heat sink, said heat source having an area of heat concentration, determining an optimum size for a thermal interface material as a function of said area of heat concentration, placing said optimally sized thermal interface material between said heat source and said heat sink, and applying compression to said optimally sized thermal interface material between said heat source and said heat sink said step of determining further comprising the steps of establishing values that represent fixed characteristics for behavior of said thermal interface material in response to compression, establishing constraining equations for an initial size of said thermal interface material, a thickness of said thermal interface material as a function of said compression, and a thermal resistance of said thermal interface material, wherein said step of determining said optimum size for said thermal interface material comprises minimizing said thermal resistance of said thermal interface material.

2. A method for mounting a heat sink to a heat source as recited in claim 1, said step of determining an optimum size further comprising providing an eta factor for defining a characteristic for a non-uniform heat source.

3. A method for mounting a heat sink to a heat source as recited in claim 2 wherein said eta factor defines a subset of a surface area of said heat source that represents an area of heat concentration.

4. A method of manufacturing an integrated circuit assembly comprising the steps of:

providing a heat sink having a base, determining a size and position of an area of heat concentration on said integrated circuit, determining an optimum size for a thermal interface material as a function of said area of heat concentration, placing said optimally sized thermal interface material between said integrated circuit and said base, and applying compression to said optimally sized thermal interface material between said integrated circuit and said base said step of determining an optimum size further comprising the steps of establishing values that represent fixed characteristics for behavior of said thermal interface material in response to compression, establishing constraining equations for an initial size of said thermal interface material, a thickness of said thermal interface material as a function of said compression, and a thermal resistance of said thermal interface material, wherein said step of determining said optimum size for said thermal interface material comprises minimizing said thermal resistance of said thermal interface material.

5. A method of manufacturing an integrated circuit as recited in claim 4 wherein said integrated circuit is a microprocessor encased in a lid.

6. A method of manufacturing a printed circuit board assembly comprising the steps of:

providing an integrated circuit mounted to a printed circuit board, said integrated circuit requiring cooling during operation and having an area of heat concentration, providing a heat sink for said integrated circuit, determining an optimum size for a thermal interface material as a function of said area of heat concentration, placing said optimally sized thermal interface material between said integrated circuit and said heat sink, and applying compression to said optimally sized thermal interface material between said integrated circuit and said heat sink said step of determining an optimum size further comprising the steps of establishing values that represent fixed characteristics for behavior of said thermal interface material in response to compression, establishing constraining equations for an initial size of said thermal interface material, a thickness of said thermal interface material as a function of said compression, and a thermal resistance of said thermal interface material, wherein said step of determining said optimum size for said thermal interface material comprises minimizing said thermal resistance of said thermal interface material.

7. A method of manufacturing a printed circuit board assembly as recited in claim 6 wherein said integrated circuit comprises a microprocessor encased in a lid.

8. A method of manufacturing an integrated circuit assembly as recited in claim 6, said step of determining an optimum size further comprising providing an eta factor for defining a characteristic for a non-uniform heat source.

9. A method of manufacturing an integrated circuit assembly as recited in claim 8 wherein said eta factor defines a subset of a surface area of said heat source that represents an area of heat concentration.

* * * * *